United States Patent
Migita et al.

(10) Patent No.: US 9,069,691 B2
(45) Date of Patent: Jun. 30, 2015

(54) CALCULATION METHOD AND COMPUTER-READABLE RECORDING MEDIUM

(71) Applicant: FUJITSU LIMITED, Kawasaki-shi (JP)

(72) Inventors: Koji Migita, Kawasaki (JP); Nobuaki Kawasoe, Yokohama (JP); Akiko Furuya, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 332 days.

(21) Appl. No.: 13/746,390

(22) Filed: Jan. 22, 2013

(65) Prior Publication Data

US 2013/0246494 A1 Sep. 19, 2013

(30) Foreign Application Priority Data

Mar. 19, 2012 (JP) ................................. 2012-062778

(51) Int. Cl.
*G06F 7/00* (2006.01)
*G06F 17/10* (2006.01)
*G06F 17/50* (2006.01)

(52) U.S. Cl.
CPC ............ *G06F 17/10* (2013.01); *G06F 17/5081* (2013.01)

(58) Field of Classification Search
None
See application file for complete search history.

(56) References Cited

U.S. PATENT DOCUMENTS

| 5,978,572 | A | 11/1999 | Toyonaga et al. | |
| 6,510,539 | B1 * | 1/2003 | Deemie et al. | 716/111 |
| 2007/0220522 | A1 * | 9/2007 | Coene et al. | 718/104 |
| 2009/0189641 | A1 * | 7/2009 | Toyonoh et al. | 326/93 |
| 2013/0246494 | A1 * | 9/2013 | Migita et al. | 708/490 |

FOREIGN PATENT DOCUMENTS

| JP | 9-81621 | 3/1997 |
| JP | 10-116915 | 5/1998 |
| JP | 2005-202610 | 7/2005 |

* cited by examiner

*Primary Examiner* — David H Malzahn
(74) *Attorney, Agent, or Firm* — Fujitsu Patent Center

(57) ABSTRACT

A calculation method executed by a computer, the calculation method includes calculating, using a processor, a length of one side of a second module based on an area of the second module that is included in a first module in a circuit and includes devices; and calculating, using the processor, a length of a wiring of the first module based on the calculated length and the number of fan-outs of the first module.

6 Claims, 14 Drawing Sheets

FIG.8

```
1   module TOP ( ITOP, OTOP );
2       input ITOP;
3
4       output [6:0] OTOP;
5
6       wire net_a;
7
8       TM0 ITM0 ( .IMOD(ITOP), .OMOD(net_a) );
9       RM0 IRM0 ( .IMOD(net_a), .OMOD(OTOP[0]) );
10      RM1 IRM1 ( .IMOD(net_a), .OMOD(OTOP[1]) );
11      RM2 IRM2 ( .IMOD(net_a), .OMOD(OTOP[2]) );
12      RM3 IRM3 ( .IMOD(net_a), .OMOD(OTOP[3]) );
13      RM4 IRM4 ( .IMOD(net_a), .OMOD(OTOP[4]) );
14      RM5 IRM5 ( .IMOD(net_a), .OMOD(OTOP[7]) );
15      RM6 IRM6 ( .IMOD(net_a), .OMOD(OTOP[6]) );
16
17  endmodule
18
19  module TM0 (IMOD, OMOD);
20      input IMOD;
21      output OMOD;
22      wire net_reg_in;
23      wire net_reg_out;
24
25      BUF IBF ( .IB(IMOD), .OB(net_reg_in) );
26      DFF IFF ( .D(net_reg_in), .Q(net_reg_out) );
27      BUF Tb0 ( .IB(net_reg_out), .OB(OMOD) );
28
29  endmodule
30
31  module RM0 (IMOD, OMOD);
32      input IMOD;
33      output OMOD;
34      wire net_buf_out;
35
36      BUF Rb0 ( .IB(IMOD), .OB(net_buf_out) );
37
38  endmodule
```

FIG.9

```
1   module TOP ( ITOP, OTOP );
2      input ITOP;
3
4      output [6:0] OTOP;
5
6      wire [2:0] net_a;
7
8      TM0 ITM0 ( .IMOD(ITOP), .OMOD(net_a), );
9      RM0 IRM0 ( .IMOD(net_a[0]), .OMOD(OTOP[0]) );
10     RM1 IRM1 ( .IMOD(net_a[0]), .OMOD(OTOP[1]) );
11     RM2 IRM2 ( .IMOD(net_a[1]), .OMOD(OTOP[2]) );
12     RM3 IRM3 ( .IMOD(net_a[1]), .OMOD(OTOP[3]) );
13     RM4 IRM4 ( .IMOD(net_a[2]), .OMOD(OTOP[4]) );
14     RM5 IRM5 ( .IMOD(net_a[2]), .OMOD(OTOP[5]) );
15     RM6 IRM6 ( .IMOD(net_a[2]), .OMOD(OTOP[6]) );
16
17  endmodule
18
19  module TM0 (IMOD, OMOD);
20     input IMOD;
21     output [2:0] OMOD;
22     wire net_reg_in;
23     wire net_reg_out;
24
25     BUF IBF ( .IB(IMOD), .OB(net_reg_in) );
26     DFF IFF ( .D(net_reg_in), .Q(net_reg_out) );
27     BUF Tb0 ( .IB(net_reg_out), .OB(OMOD[0]) );
28     BUF Tb1 ( .IB(net_reg_out), .OB(OMOD[1]) );
29     BUF Tb2 ( .IB(net_reg_out), .OB(OMOD[2]) );
30
31  endmodule
32
33  module RM0 (IMOD, OMOD);
34     input IMOD;
35     output OMOD;
36     wire net_buf_out;
37
38     BUF Rb0 ( .IB(IMOD), .OB(net_buf_out) );
39
40  endmodule
```

FIG.10

```
1   module TOP ( ITOP, OTOP );
2       input ITOP;
3
4       output [6:0] OTOP;
5
6       wire [2:0] net_a;
7
8       TM0 ITM0 ( .IMOD(ITOP), .OMOD(net_a), );
9       RM0 IRM0 ( .IMOD(net_a[0]), .OMOD(OTOP[0]) );
10      RM1 IRM1 ( .IMOD(net_a[0]), .OMOD(OTOP[1]) );
11      RM2 IRM2 ( .IMOD(net_a[1]), .OMOD(OTOP[2]) );
12      RM3 IRM3 ( .IMOD(net_a[1]), .OMOD(OTOP[3]) );
13      RM4 IRM4 ( .IMOD(net_a[2]), .OMOD(OTOP[4]) );
14      RM5 IRM5 ( .IMOD(net_a[2]), .OMOD(OTOP[5]) );
15      RM6 IRM6 ( .IMOD(net_a[2]), .OMOD(OTOP[6]) );
16
17  endmodule
18
19  module TM0 (IMOD, OMOD);
20      input IMOD;
21      output [2:0] OMOD;
22      wire net_reg_in;
23
24      BUF IBF ( .IB(IMOD), .OB(net_reg_in) );
25      DFF Tf0 ( .D(net_reg_in), .Q(OMOD[0]) );
26      DFF Tf1 ( .D(net_reg_in), .Q(OMOD[1]) );
27      DFF Tf2 ( .D(net_reg_in), .Q(OMOD[2]) );
28
29  endmodule
30
31  module RM0 (IMOD, OMOD);
32      input IMOD;
33      output OMOD;
34      wire net_buf_out;
35
36      BUF Rb0 ( .IB(IMOD), .OB(net_buf_out) );
37
38  endmodule
```

CALCULATION METHOD AND COMPUTER-READABLE RECORDING MEDIUM

CROSS-REFERENCE TO RELATED APPLICATIONS

This application is based upon and claims the benefit of priority of the prior Japanese Patent Application No. 2012-062778, filed on Mar. 19, 2012, the entire contents of which are incorporated herein by reference.

FIELD

The embodiment discussed herein is related to a calculation method and a computer-readable recording medium.

BACKGROUND

Conventionally, there are technologies for synthesizing logic circuits using a computer. For example, there is a technology for synthesizing logic circuits based on a file in which a register transfer level (RTL) is described using a hardware description language. As examples of such a hardware description language, there are a very high speed integrated circuits hardware description language (VHDL) and Verilog-HDL. In addition, in the process of synthesizing logic circuits, the timing of signals of synthesized logic circuits is analyzed. After the process of synthesizing logic circuits, there is a process of performing physical design of circuits.
Patent Literature 1: Japanese Laid-open Patent Publication No. 10-116915
Patent Literature 2: Japanese Laid-open Patent Publication No. 2005-202610
Patent Literature 3: Japanese Laid-open Patent Publication No. 09-081621

However, in the above-described conventional technologies, there is a problem in that the timing is degraded in the process of performing physical design.

For example, in the conventional technology, there are cases where the timing of internal signals in the process of performing physical design changes from the timing of internal signals analyzed in the process of synthesizing logic circuits depending on the size or the shape of the physically-designed area. In such a case, depending on the situation of a change in the timing, the process is returned to the process of synthesizing logic circuits from the process of performing physical design, again, logic replication of signals is performed in the process of synthesizing logic circuits, and the timing of internal signals is corrected so as to allow the circuit to normally operate.

As above, in the conventional technologies, even when the timing of signals is analyzed in the process of synthesizing logic circuits, there are cases where the timing of signals is degraded in the process of performing physical design depending on the size or the shape of the area of the circuit that is physically designed in the process of performing physical design. In such a case, since the process is returned to the process of synthesizing logic circuits from the process of performing physical design, there is a problem in that a loss of the process occurs.

SUMMARY

According to an aspect of an embodiment, a calculation method executed by a computer, the calculation method includes calculating, using a processor, a length of one side of a second module based on an area of the second module that is included in a first module in a circuit and includes devices; and calculating, using the processor, a length of a wiring of the first module based on the calculated length and the number of fan-outs of the first module.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is an example of a hardware description language described in a file that corresponds to the net illustrated in FIG. 2 as an example;

FIG. 9 is an example of a hardware description language described in a file that corresponds to the net illustrated in FIG. 6 as an example;

FIG. 10 is an example of a hardware description language described in a file that corresponds to the net illustrated in FIG. 7 as an example;

DESCRIPTION OF EMBODIMENTS

Preferred embodiments of the present invention will be explained with reference to accompanying drawings. However, the embodiment is not for the purpose of limiting the technology disclosed here.

Figure 1:
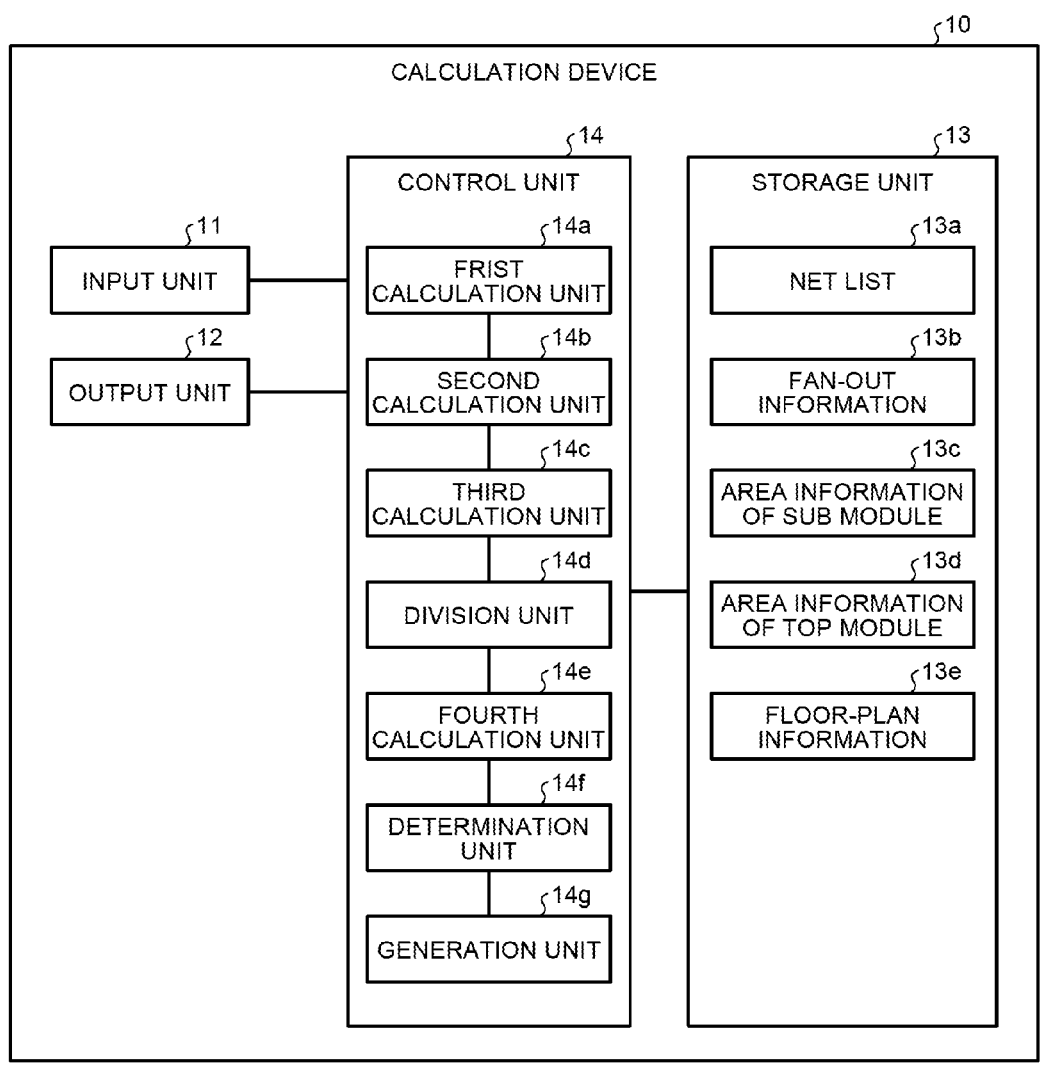
FIG. 1 is a diagram that illustrates an example of the functional configuration of a calculation device according to an embodiment.

A calculation device according to an embodiment will be described. FIG. 1 is a diagram that illustrates an example of the functional configuration of the calculation device according to the embodiment.

Functional Configuration of Calculation Device

As illustrated in FIG. 1, a calculation device 10 includes an input unit 11, an output unit 12, a storage unit 13, and a control unit 14. The calculation device 10 according to this embodiment performs a calculation process and a replication process to be described later before a physical design process, and a processing result acquired by the calculation device 10 can be used in the physical design process. The calculation device 10 can perform a calculation process and a replication process in a process before the physical design process, for example, a logic synthesis process.

The input unit 11 inputs various kinds of information to the control unit 14. For example, the input unit 11 receives an instruction on performing a calculation process to be described later from a user and inputs the received instruction to the control unit 14. In such an instruction, an RTL file and a constraint condition are included. The RTL file is a file in which an RTL is described using a hardware description language. The constraint condition is a predetermined condition that is used when automatic circuit synthesis is performed. In addition, the input unit 11 receives various instructions from the user and inputs the received instructions to the control unit 14. As examples of a device that is used as the input unit 11, there are devices such as a mouse and a keyboard that receive a user's operation.

The output unit 12 outputs various kinds of information. For example, the output unit 12 displays a logic circuit that is represented by an updated net list 13a under the control of a generation unit 14g to be described later. As an example of a device used as the output unit 12, there is a liquid crystal display.

The storage unit 13 stores various kinds of information. For example, the storage unit 13 stores the net list 13a, fan-out information 13b, area information 13c of sub modules, area information 13d of a top module, and floor plan information 13e.

Figure 2:
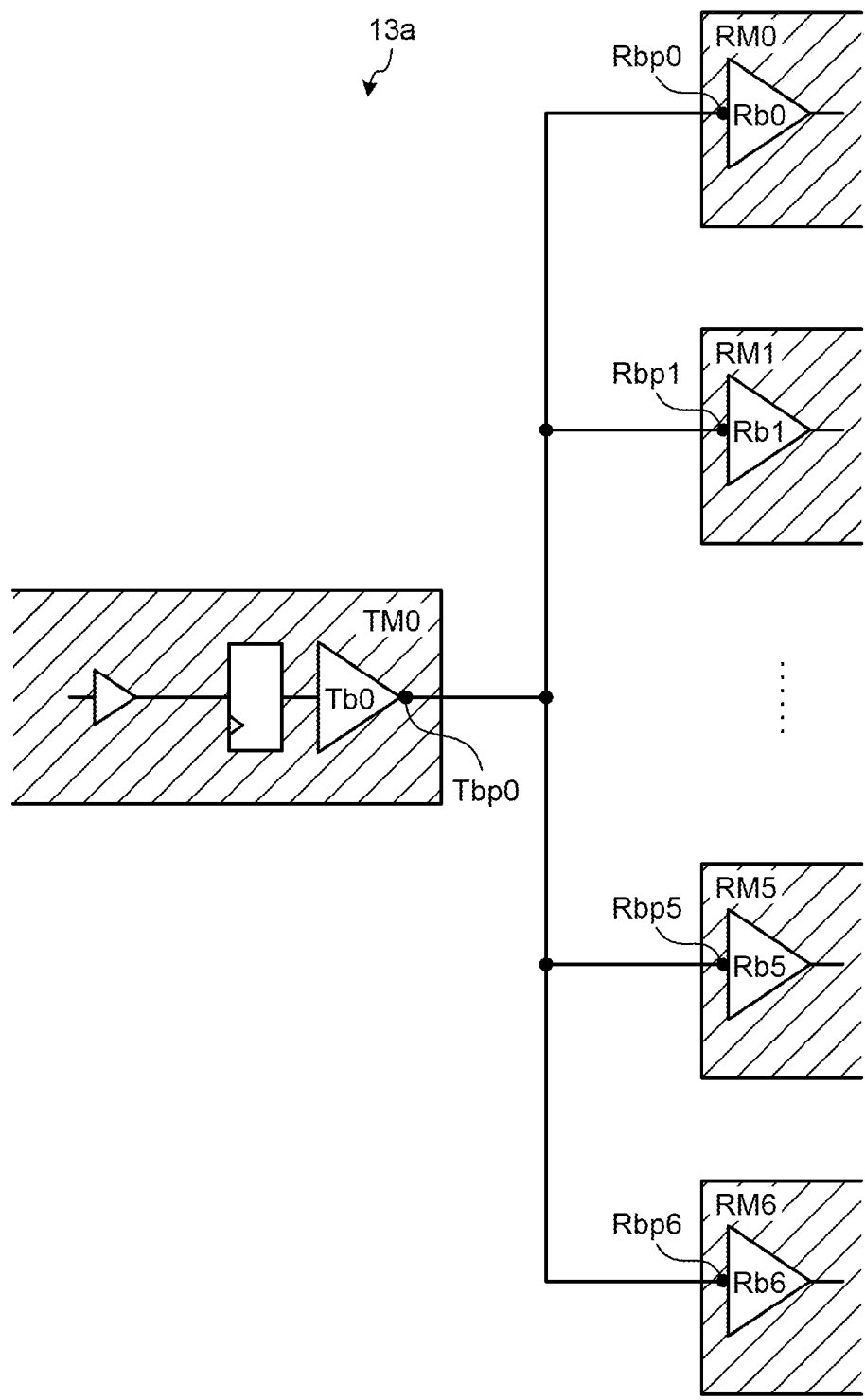
FIG. 2 is a diagram that illustrates an example of a logic circuit that is represented by a net list.

The net list 13a is connection information of cells in a gate level. Here, the net list 13a is generated by a first calculation unit 14a to be described later. FIG. 2 is a diagram that illustrates an example of a logic circuit that is represented by the net list. In the example illustrated in FIG. 2, the logic circuit that is represented by the net list 13a illustrates a case in which sub modules TM0, RM0, RM1, . . . , RM5, and RM6 are included in the top module. The sub module TM0 includes a buffer Tb0 and transmits a signal from the buffer Tb0 to the sub modules RM0, RM1, . . . , RM5, and RM6. In other words, the sub module TM0 is a module that outputs a signal, and the sub modules RM0, RM1, . . . , RM5, and RM6 are modules to which signals are input. The sub modules RM0, RM1, . . . , RM5, and RM6 include buffers Rb0, Rb1, . . . , Rb5, and Rb6, respectively. The sub modules RM0, RM1, . . . , RM5, and RM6 receive signals transmitted from the sub module TM0 using the buffers Rb0, Rb1, . . . , Rb5, and Rb6, respectively. Then, the sub modules RM0, RM1, . . . , RM5, and RM6 output the received signals to a flip flop (FF), which is not illustrated in the diagram, installed at a rear stage. Here, in the example illustrated in FIG. 2, signals are output from one sub module TM0 that outputs signals to seven sub modules RM0, RM1, . . . , RM5, and RM6, and accordingly, the number of fan-outs is seven.

In other words, the net list 13a represents a logic circuit of m top modules to which a plurality of sub modules are connected. Each of m top modules can be identified by a net N(m) (where m=0, 1, . . . , n−1).

The fan-out information 13b is information relating to fan-outs that is calculated by the first calculation unit 14a. For example, the fan-out information 13b includes: the number of fan-outs in a logic circuit; an identifier of an output terminal that outputs a signal; an identifier of a device that has an output terminal; an identifier of an input terminal to which a signal is input; and an identifier of a device that has an input terminal. For example, in a case where the net list 13a that is illustrated in the example illustrated in FIG. 2 is generated by the first calculation unit 14a, the fan-out information 13b, which includes the number of fan-outs of "7", an identifier "Tbp0" of the output terminal that outputs a signal, and an identifier "Tb0" of a buffer that has an output terminal "Tbp0", is generated by the first calculation unit 14a. In addition, in the fan-out information 13b, identifiers "Rbp0" to "Rbp6" of input terminals to which signals are input and identifiers "Rb0" to "Rb6" of buffers that respectively have the input terminals "Rbp0" to "Rbp6" are included.

The area information 13c of the sub module is information that relates to the area of the sub module that is calculated by the first calculation unit 14a. For example, the area information of the sub module includes the area of the sub module.

The area information 13d of the top module is information that relates to the area of the top module that is calculated by the first calculation unit 14a. For example, the area information of the top module includes the area of all the sub modules.

The floor plan information 13e is information that represents the positions of devices to be arranged, the area of each device, and the like. For example, the floor plan information 13e is used for calculating a ratio (cell usage ratio) D of the area of a device such as the FF or the buffer to the area Ae of the top module that is represented by the area information 13d of the top module.

The storage unit 13, for example, is a semiconductor memory device such as a flash memory or a storage device such as a hard disk or an optical disk. In addition, the storage unit 13 is not limited to the storage device of the above-described type but may be a random access memory (RAM) or a read only memory (ROM).

The control unit 14 includes an internal memory that is used for storing a program defining various processing sequences and control data and performs various processes in accordance with the program and the control data. As illustrated in FIG. 1, the control unit 14 includes the first calculation unit 14a, a second calculation unit 14b, a third calculation unit 14c, a division unit 14d, a fourth calculation unit 14e, a determination unit 14f, and the generation unit 14g.

The first calculation unit 14a calculates the length of one side of the sub module based on the area of the sub module that is included in the top module. For example, the first calculation unit 14a synthesizes a logic circuit so as to satisfy a constraint condition and generates the net list 13a, the fan-out information 13b, the area information 13c of the sub module, and the area information 13d of the top module. Then, the first calculation unit 14a performs the process as follows for all the sub modules by referring to the area information 13d of the top module. In other words, the first calculation unit 14a assumes the shape of the area of the sub module as a square and calculates the square root of the area of the sub module, thereby calculating a length of one side of the area of the sub module.

Figure 3:
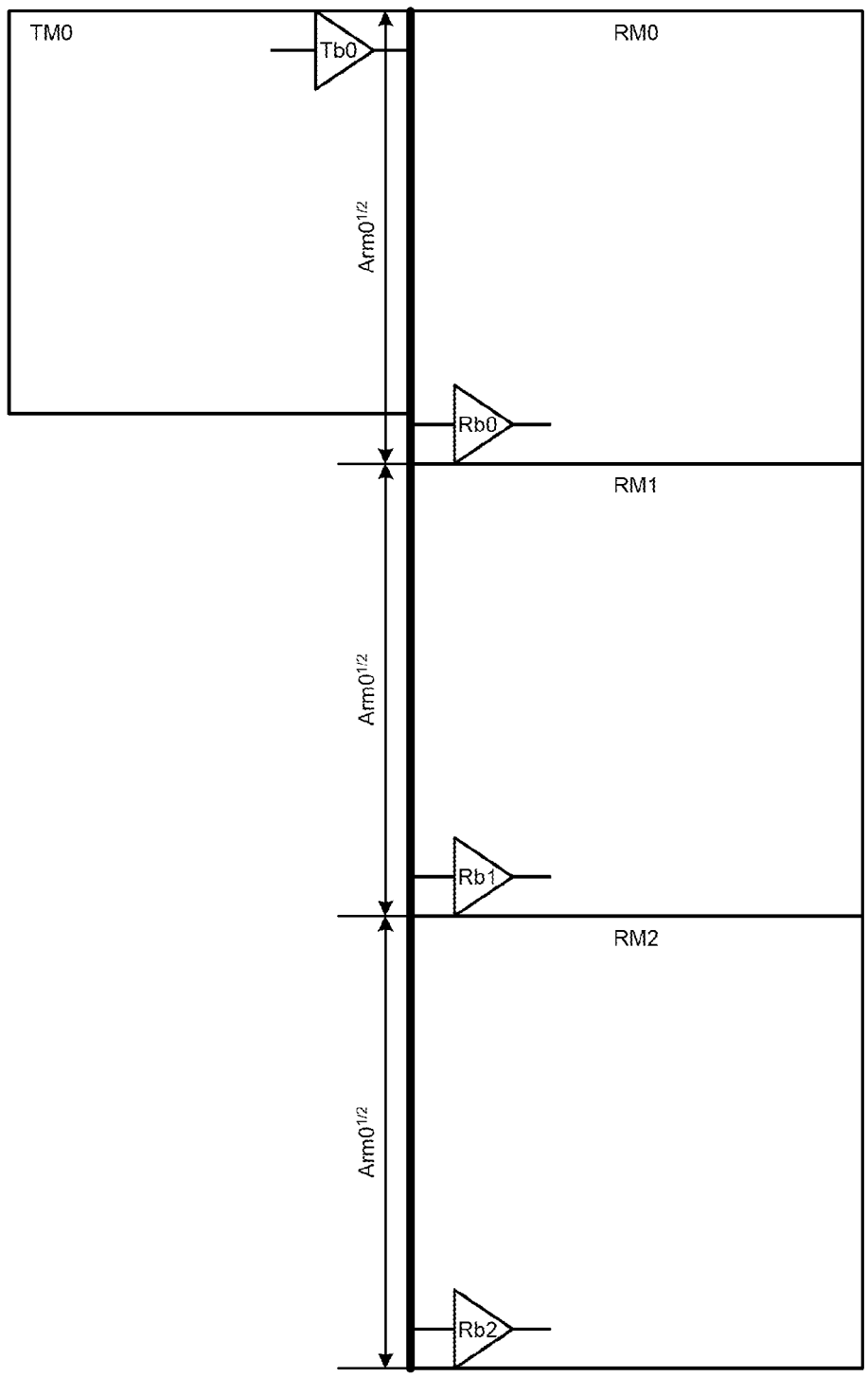
FIG. 3 is a diagram that illustrates an example of the process that is performed by the calculation device according to the embodiment.

FIG. 3 is a diagram that illustrates an example of the process that is performed by the calculation device according to the embodiment. FIG. 3 illustrates a logic circuit in which signals are output from a buffer Tb0 of a sub module TM0 to a buffer Rb0 of a sub module RM0, a buffer Rb1 of a sub module RM1, and a buffer Rb2 of a sub module RM2. In other words, the logic circuit represented in the example illustrated in FIG. 3 has "3" as the number of fan-outs. The example represented in FIG. 3 illustrates a case where the buffer Tb0 is disposed on the upper right side of the sub module TM0, the buffers Rb0, Rb1, and Rb2 are disposed on the lower left side of the sub modules RM0, RM1, and RM2, and the buffers Rb0, Rb1, and Rb2 are connected to the buffer Tb0 in FIG. 3.

In the example illustrated in FIG. 3, the first calculation unit 14a assumes the shape of the area of each one of the sub modules RM0, RM1, and RM2 as a square, calculates the square root of the area, and sets the calculated square root as the length of one side of the area. Here, as illustrated in the example represented in FIG. 3, in a case where the area of each one of the sub modules RM0, RM1, and RM2 to which signals are input is "Arm0" and is the same, the first calculation unit 14a can perform the process as follows. The first calculation unit 14a can calculate $(Arm0)^{1/2}$ as the length of one side of the area of each one of the sub modules RM0, RM1, and RM2.

Figure 4:
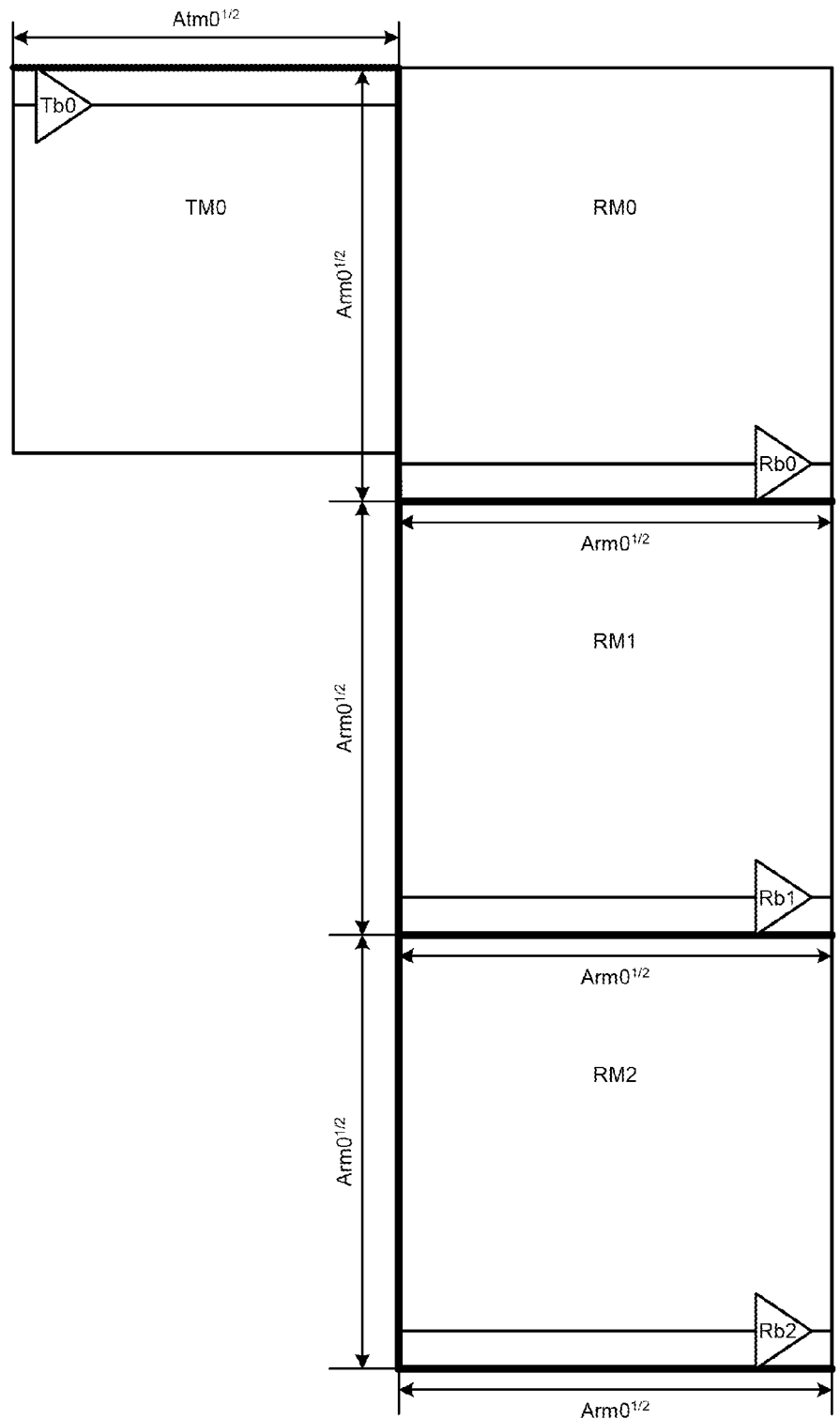
FIG. 4 is a diagram that illustrates an example of another process that is performed by a calculation device according to the embodiment.

FIG. 4 is a diagram that illustrates an example of another process that is performed by the calculation device according to the embodiment. FIG. 4 illustrates a logic circuit in which signals are output from a buffer Tb0 of a sub module TM0 to a buffer Rb0 of a sub module RM0, a buffer Rb1 of a sub module RM1, and a buffer Rb2 of a sub module RM2 as well. In other words, the logic circuit represented in the example illustrated in FIG. 4 has "3" as the number of fan-outs. The example represented in FIG. 4 illustrates a case where the buffer Tb0 is disposed on the upper left side of the sub module TM0, the buffers Rb0, Rb1, and Rb2 are disposed on the lower right side of the sub modules RM0, RM1, and RM2, and the buffers Rb0, Rb1, and Rb2 are connected to the buffer Tb0 in FIG. 4. In the example represented in FIG. 4, a first calculation unit 14a assumes the shape of the area of each one of the sub modules TM0, RM0, RM1, and RM2 as a square, calculates the square root of the area, and sets the calculated square root as the length of one side of the area. The example represented in FIG. 4 illustrates a case in which the area of the sub module TM0 that outputs signals is "Atm0", and the area of each one of the sub modules RM0, RM1, and RM2 to which signals are input is "Arm0". In this case, the first calculation unit 14a can calculate $(Atm0)^{1/2}$ as the length of one side of the area for the sub module TM0 and can calculate $(Arm0)^{1/2}$ as the length of one side of the area for each one of the sub modules RM0, RM1, and RM2.

The first calculation unit 14a performs the process of calculating the length of one side of the sub module in this way for all the combinations of sub modules that output signals and sub modules that receive input signals. Here, the combinations of the sub modules that output signals and the sub modules that receive input signals represent the nets N(m) (where, m=0, 1, ..., n−1) described above, and each of the nets N(m) represents information of a logic circuit in which a plurality of sub modules are connected.

The second calculation unit 14b calculates a length Lt of the wiring for the combination of the sub modules that output signals and the sub modules that receive input signals based on the length of one side that is calculated by the first calculation unit 14a and the number of fan-outs in the combination of the sub modules that output signals and the sub modules that receive input signals. In description presented below, the length Lt of the wiring may be denoted by a "total wiring length Lt".

A specific example will be described. For example, in a case where $(Arm0)^{1/2}$ is calculated as the length of one side of the area of each one of the sub modules RM0, RM1, and RM2 by the first calculation unit 14a, as illustrated in the example represented in FIG. 3, the second calculation unit 14b performs the process as follows. In other words, the second calculation unit 14b calculates a value "$((Arm0)^{1/2})\times3$" that is acquired by multiplying $(Arm0)^{1/2}$ by the number of fan-outs, which is "3", as the length of the wiring of the combination of the sub module that outputs a signal illustrated in the example represented in FIG. 3 and the sub modules that receive input signals.

In addition, in a case where $(Atm0)^{1/2}$ is calculated as the length of one side of the area of the sub module TM0, and $(Arm0)^{1/2}$ is calculated as the length of one side of the area of each one of the sub modules RM0, RM1, and RM2, as illustrated in the example represented in FIG. 4, the second calculation unit 14b may perform the process as follows. In other words, the second calculation unit 14b may calculate a value "$((Atm0)^{1/2})+((Arm0)^{1/2})\times3\times2$" that is acquired by adding a value calculated by multiplying $(Arm0)^{1/2}$ by a value acquired by doubling the number of fan nets which is "3" to $(Atm0)^{1/2}$ as the length of the wiring of the combination of the sub module that outputs a signal and the sub module that receives an input signal.

The second calculation unit 14b performs the process of calculating a length of the wiring in this way for all the combinations of the sub modules that outputs signals and the sub modules that receive input signals.

In this way, the calculation device 10 according to this embodiment assumes the shape of the area of the sub module as a square and calculates a length of the wiring using the square root of the area of the sub module. Thus, according to the calculation device 10 of this embodiment, the length of the wiring can be calculated in a simple manner.

The third calculation unit 14c calculates the number Nc of devices of which the logic is to be replicated based on the cell usage ratio. For example, the third calculation unit 14c, first, acquires the floor plan information 13e from the storage unit 13. Then, the third calculation unit 14c calculates a ratio D of the area Ae of the entire top module that is represented by the area information 13d of the top module to the area of a device that is represented by the floor plan information 13e. In other words, the third calculation unit 14c calculates the cell usage ratio D. Subsequently, the third calculation unit 14c calculates a determination coefficient k of the number of replications that is mapped to the cell usage ratio D. Here, the determination coefficient k is a coefficient that is used for calculating the number of devices (FFs and buffers) of which the logic is replicated.

Figure 5:
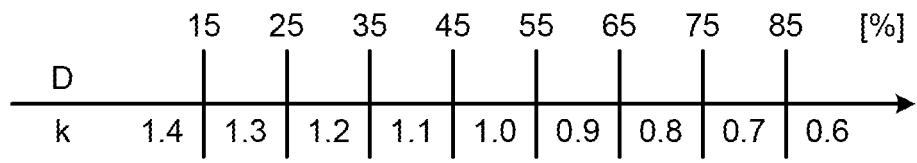
FIG. 5 is a diagram that illustrates an example of correspondence relation between a cell usage ratio and a determination coefficient of the number of replications.

FIG. 5 is a diagram that illustrates an example of correspondence relation between the cell usage ratio and the determination coefficient of the number of replications. In the example represented in FIG. 5, the cell usage ratio D and the determination coefficient k are mapped to each other such that the determination coefficient k decreases as the cell usage ratio D increases. In FIG. 5, a case is illustrated as an example in which a cell usage ratio D that is 15% or less is mapped to a value "1.4" of the determination coefficient k. In addition, in FIG. 5, the case is illustrated as an example in which a cell usage ratio D that is in a range of 15% or more and 25% or less is mapped to a value "1.3" of the determination coefficient k. Furthermore, in FIG. 5, the case is illustrated as an example in which a cell usage ratio D that is in a range of 25% or more and 35% or less is mapped to a value "1.2" of the determination coefficient k. In addition, in FIG. 5, the case is illustrated as an example in which a cell usage ratio D that is in a range of 35% or more and 45% or less is mapped to a value "1.1" of the determination coefficient k. Furthermore, in FIG. 5, the case is illustrated as an example in which a cell usage ratio D that is in a range of 45% or more and 55% or less is mapped to a value "1.0" of the determination coefficient k. In addition, in FIG. 5, the case is illustrated as an example in which a cell usage ratio D that is in a range of 55% or more and 65% or less is mapped to a value "0.9" of the determination coefficient k. Furthermore, in FIG. 5, the case is illustrated as an example in which a cell usage ratio D that is in a range of 65% or more and 75% or less is mapped to a value "0.8" of the determination coefficient k. In addition, in FIG. 5, the case is illustrated as an example in which a cell usage ratio D that is in a range of 75% or more and 85% or less is mapped to a value "0.7" of the determination coefficient k. Furthermore, in FIG. 5, the case is illustrated as an example in which a cell usage ratio D that is 85% or more is mapped to a value "0.6" of the determination coefficient k.

In the case of the example represented in FIG. 5, in a case where a value of 14% is calculated as the cell usage ratio D, the third calculation unit 14c acquires a value "1.4" as the determination coefficient k. In the case of the example represented in FIG. 5, in a case where a value of 50% is calculated as the cell usage ratio D, the third calculation unit 14c acquires a value "1.0" as the determination coefficient k. In addition, in a case where another value is calculated as the cell usage ratio D, the third calculation unit 14c acquires a value of the determination coefficient k in the same manner. In this way, the third calculation unit 14c calculates a determination coefficient k. Furthermore, the third calculation unit 14c may derive a cell usage ratio D by a predetermined value regarding the cell usage ratio D, for example, as 50% without calculating the cell usage ratio D by using the floor plan information 13e. In such a case, the third calculation unit 14c calculates a determination coefficient k using the above-described method by using the derived cell usage ratio D.

Then, the third calculation unit 14c determines a natural value N that satisfies the following Equation (1) and sets the determined natural number N as the number Nc of replications.

$$N \leq k \cdot (Lt/Lb) < (N+1) \tag{1}$$

Here, Lb is a value that is determined in advance and is a threshold of the wiring length that is used for determining whether or not the logic replication using a buffer is performed in a logic circuit. An example of a method of calculating Lb will be described later.

In this way, the third calculation unit 14c performs the process of calculating the number Nc of replications for all the combinations of sub modules that output signals and sub modules that receive input signals. Here, when the number of devices of which the logic is replicated exceeds the number of fan-outs, a status is formed in which a plurality of output devices are connected to one input device. For example, in a case where the number of replications is three, and the number of fan-outs is two, while only one output device is connected to one input device, two output devices are connected to the other input device. However, in this embodiment, a change to such a circuit configuration is not made. Based on this, in a case where the number Nc of replications representing the number of devices of which the logic is replicated exceeds the number of fan-outs, the third calculation unit 14c corrects the number Nc of replications to a maximum number of devices of which the logic can be replicated, in other words, to the number of fan-outs.

The division unit 14d divides sub modules into groups that are divided through logic replication. For example, the division unit 14d divides sub modules into groups that correspond to a number represented by the number Nc of replications. For example, the division unit 14d, first, determines whether or not the number Nc of replications is greater than one. Then, in a case where the number Nc of replications is greater than one, the division unit 14d divides the sub modules into groups that correspond to a number represented by the number Nc of replications.

A specific example will be described. As illustrated in FIG. 2, a case will be described in which seven sub modules RM0 to RM6 are divided into groups through logic replication, and the number Nc of replications is "3". In such a case, the division unit 14d divides the sub modules into three groups, for example, including a group {RM0, RM1}, a group {RM2, RM3}, and a group {RM4, RM5, RM6}.

In this way, the division unit 14d can divide the sub modules that include input devices to which signals of multiple fan-outs are input into Nc groups. The division unit 14d performs the process of dividing the sub modules into groups that are divided through logic replication in this way for all the combinations of sub modules that output signals and sub modules that receive input signals.

The fourth calculation unit 14e calculates wiring lengths Lj (where, j=0, 1, . . . , Nc−1) of sub modules for each group. For example, in a case where an output device that outputs a fan-out signal and an input device to which the fan-out signal is input are included in sub modules that are different from each other, the fourth calculation unit 14e calculates a sum of wiring lengths of the sub modules for each group. Here, the wiring length of the sub module represents the length of one side of the area that is calculated by the first calculation unit 14a. On the other hand, in a case where an output device that outputs a fan-out signal and an input device to which the fan-out signal is input are included in the same sub module, the fourth calculation unit 14e sets a value (Lt/Nc) acquired by dividing a "total wiring length Lt" by the number Nc of replications as a wiring length Lj (where, j=0, 1, . . . , Nc−1) of the sub module.

A specific example will be described. As described above, the case will be described in which the sub modules are divided into three groups including the group {RM0, RM1}, the group {RM2, RM3}, and the group {RM4, RM5, RM6} by the division unit 14d. Here, it is assumed that "5.5" is calculated as the length of one side of the area by the first calculation unit 14a for all the seven sub modules RM0 to RM6. In such a case, the fourth calculation unit 14e calculates a sum "11 (5.5+5.5)" of the wiring lengths of the group {RM0, RM1}. In addition, the fourth calculation unit 14e calculates a sum "11 (5.5+5.5)" of the wiring lengths of the group {RM2, RM3}. Furthermore, the fourth calculation unit 14e calculates a sum "16.5 (5.5+5.5+5.5)" of the wiring lengths of the group {RM4, RM5, RM6}.

The fourth calculation unit 14e performs the process of calculating the wiring lengths Lj (where, j=0, 1, . . . , Nc−1) in this way for all the combinations of sub modules that output signals and sub modules that receive input signals.

The determination unit 14f determines the type of device of which the logic is replicated in a sub module that outputs a signal based on the wiring length Lj of the sub module that is calculated by the fourth calculation unit 14e.

For example, the determination unit 14f, first, compares max(Lj) and Lf with each other. Then, in a case where max (Lj) is less than Lf, the determination unit 14f determines that logic replication of buffers is performed. On the other hand, in a case where max(Lj) is Lf or more, logic replication of FFs is determined. Here, Lf is a value that is determined in advance and is a threshold of the wiring length that is used for determining whether or not logic replication using an FF is performed in a logic circuit. An example of the method of calculating Lf will be described later.

The determination unit 14f performs the process of determining the type of device of which the logic is replicated in a sub module, which outputs a signal, in this way for all the combinations of sub modules that output signals and sub modules that receive input signals.

The generation unit 14g generates data of logic replication using a device of the type determined by the determination unit 14f for each combination of sub modules that output signals and sub modules that receive input signals and updates the net list 13a so as to reflect the generated data on the net list 13a.

Figure 6:
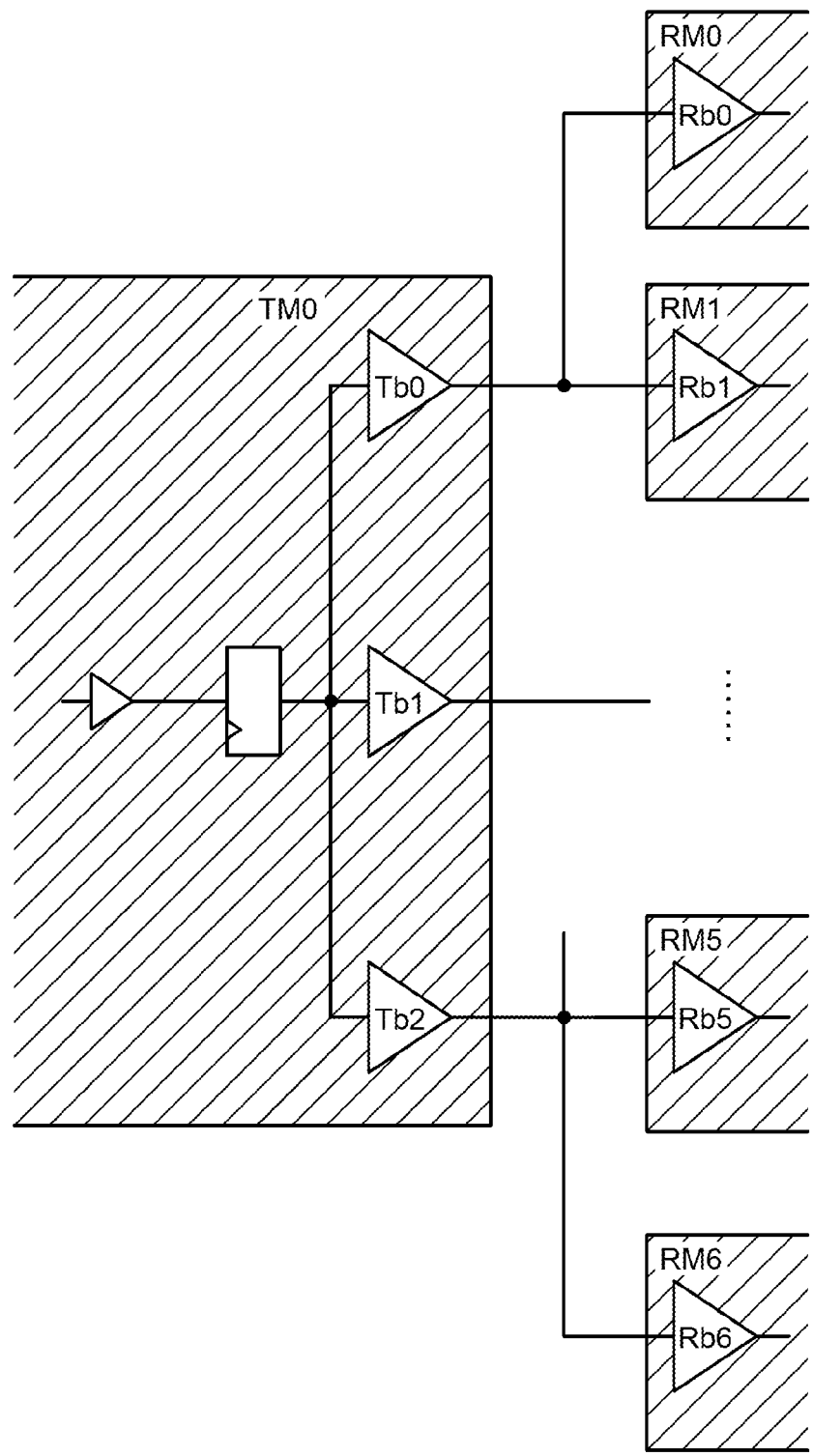
FIG. 6 is a diagram that illustrates an example of a net in which logic replication of buffers is performed.

For example, in a case where logic replication of buffers is determined by the determination unit 14f, when the output terminal is a buffer, the generation unit 14g performs logic replication of buffers corresponding to a value (Nc−1) that is acquired by decreasing the number Nc of replications by one. In addition, in a case where logic replication of buffers is determined by the determination unit 14f, when the output terminal is an FF, the generation unit 14g performs logic replication of buffers that correspond to the number Nc of replications. Accordingly, as a result of the replication, buffers corresponding to the number that is represented by the number Nc of replications are disposed in a module that outputs a fan-out signal in the net, and signals are output from the buffers. FIG. 6 is a diagram that illustrates an example of a net in which logic replication of buffers is performed. For example, in the example represented in FIG. 2, in a case where "3" is calculated as the number Nc of replications by the third calculation unit 14c, and logic replication of buffers is determined by the determination unit 14f, as illustrated in the example represented in FIG. 6, buffers Tb1 and Tb2 are newly disposed, and a group of sub modules of the groups that are divided by the division unit 14d is connected to the buffers Tb0, Tb1, and Tb2. For example, a buffer Rb0 of the sub module RM0 and a buffer Rb1 of the sub module RM1 are connected to the buffer Tb0. In addition, a buffer Rb2 of the sub module RM2 and a buffer Rb3 of the sub module RM3 are connected to the buffer Tb1. Furthermore, a buffer Rb4 of the sub module RM4, a buffer Rb5 of the sub module RM5, and a buffer Rb6 of the sub module RM6 are connected to the buffer Tb2.

Figure 7:
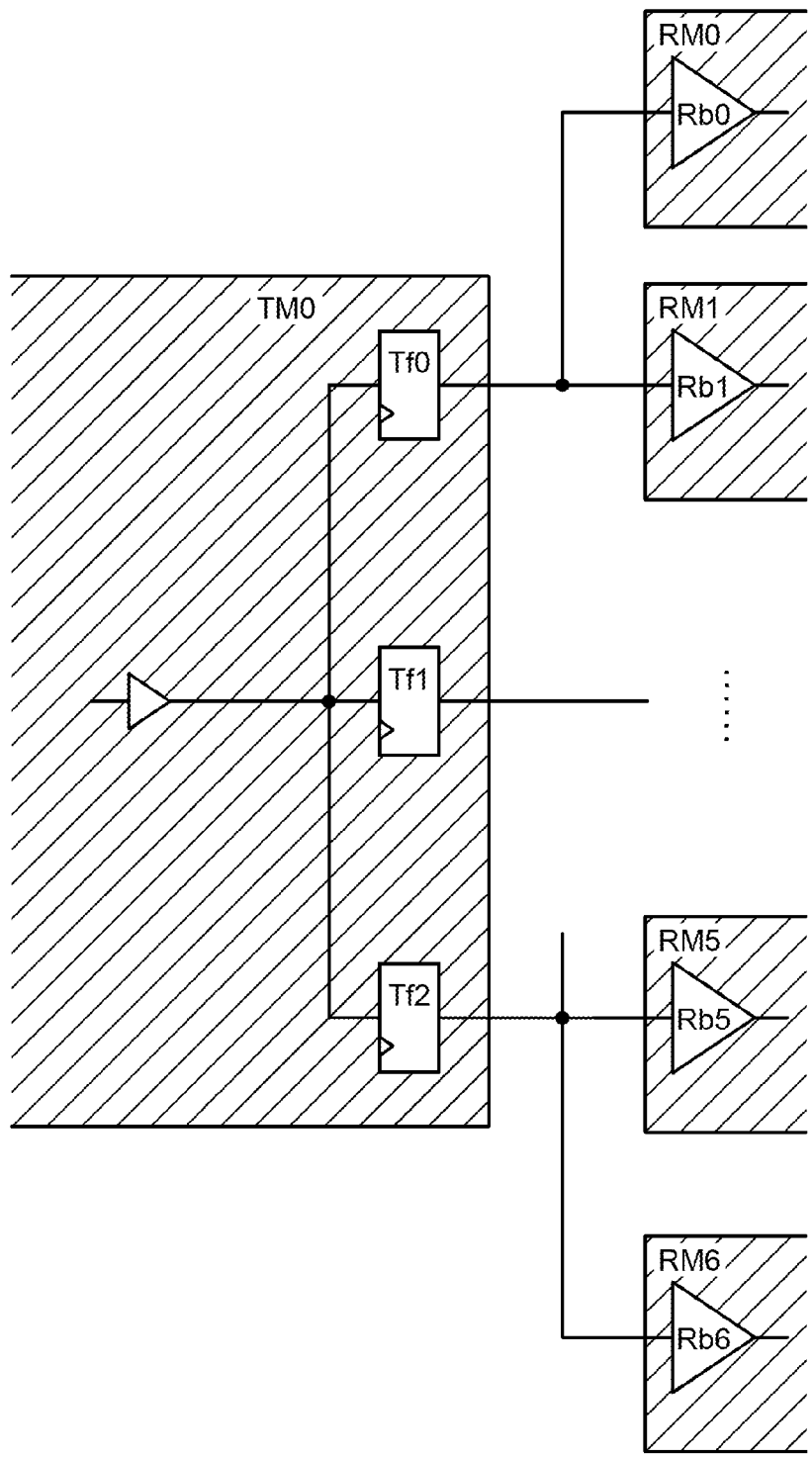
FIG. 7 is a diagram that illustrates an example of a net in which logic replication of FFs is performed.

On the other hand, in a case where logic replication of FFs is determined by the determination unit 14f, when the output terminal is an FF, the generation unit 14g performs logic replication of FFs corresponding to a value (Nc−1) that is acquired by decreasing the number Nc of replications by one. In addition, in a case where logic replication of FFs is determined by the determination unit 14f, when the output terminal is a buffer, the generation unit 14g goes back to an FF from the input of the buffer and performs logic replication of FFs that correspond to a value (Nc−1) that is acquired by decreasing the number Nc of replications by one. Accordingly, as a result of the replication, FFs corresponding to the number that is represented by the number Nc of replications are disposed in a module that outputs a fan-out signal in the net, and signals are output from the FFs. FIG. 7 is a diagram that illustrates an example of a net in which logic replication of FFs is performed. For example, in the example represented in FIG. 2, in a case where "3" is calculated as the number Nc of replications by the third calculation unit 14c, and logic replication of FFs is determined by the determination unit 14f, as illustrated in the example represented in FIG. 7, three FFs Tf0 to Tf2 are newly disposed instead of the buffer Tb0, and a group of sub modules of groups that are divided by the division unit 14d is connected to the FFs Tf0, Tf1, and Tf2. For example, the buffer Rb0 of the sub module RM0 and the buffer Rb1 of the sub module RM1 are connected to the FF Tf0. In addition, the buffer Rb2 of the sub module RM2 and the buffer Rb3 of the sub module RM3 are connected to the FF Tf1. Furthermore, the buffer Rb4 of the sub module RM4, the buffer Rb5 of the sub module RM5, and the buffer Rb6 of the sub module RM6 are connected to the FF Tf2.

Then, the generation unit 14g updates the net list 13a so as to reflect the logic-replicated data on the net list 13a. The generation unit 14g generates the logic-replicated data in this way for each combination of sub modules that output signals and sub modules that receive input signals. In addition, the generation unit 14g performs the process of updating the net list 13a so as to reflect the generated data on the net list 13a for each combination of sub modules that output signals and sub modules that receive input signals.

In this way, the calculation device 10 according to this embodiment calculates a wiring length Lj for each group, determines a type of device for logic replication based on whether or not a maximum value max(Lj) of the wiring lengths Lj is less than LF, and performs logic replication of devices of the determined type. In other words, the calculation device 10 according to this embodiment performs logic replication without performing a timing analysis and the like. Therefore, according to the calculation device 10 of this embodiment, logic replication is performed regardless of the timing of signals, whereby the degradation of the timing that may occur in a physical design process can be avoided in advance.

In addition, since the calculation device 10 according to this embodiment performs logic replication without using information that is acquired in the physical design process, logic replication with high accuracy can be performed before the physical design process.

Here, examples of a file in which an RTL is described using a hardware description language which corresponds to the nets illustrated in the examples represented in FIGS. 2, 6, and 7 will be described with reference to FIGS. 8 to 10. The examples represented in FIGS. 8 to 10 illustrate a case where Verilog-HDL is used as the hardware description language, and not all the descriptions of the Verilog-HDL but only some thereof are illustrated.

FIG. 8 is an example of a hardware description language described in a file that corresponds to the net illustrated in FIG. 2 as an example. The example represented in FIG. 8 illustrates a case where a sub module TM0 includes a buffer IBF, an FF IFF, and a buffer Tb0, a terminal D of the FF IFF is connected to an output terminal of the buffer IBF, and a terminal Q of the FF IFF is connected to an input terminal of the buffer Tb0. In addition, the example represented in FIG. 8 illustrates that an output terminal of the buffer Tb0 is connected to an input terminal of a buffer Rb0 of the sub module RM0.

FIG. 9 is an example of a hardware description language described in a file that corresponds to the net illustrated in FIG. 6 as an example. The example represented in FIG. 9 illustrates a case where a sub module TM0 includes a buffer IBF, an FF IFF, and buffers Tb0, Tb1, and Tb2, and a terminal D of the FF IFF is connected to an output terminal of the buffer IBF. In addition, the example represented in FIG. 9 illustrates a case where a terminal Q of the FF IFF is connected to input terminals of the buffers Tb0, Tb1, and Tb2. Furthermore, the example represented in FIG. 9 illustrates that an output terminal of the buffer Tb0 is connected to an input terminal of a buffer Rb0 of a sub module RM0.

FIG. 10 is an example of a hardware description language described in a file that corresponds to the net illustrated in FIG. 7 as an example. The example represented in FIG. 10 illustrates a case where a sub module TM0 includes a buffer IBF and FFs Tf0, Tf1, and Tf2, and terminals D of the FFs Tf0, Tf1, and Tf2 are connected to an output terminal of the buffer IBF. In addition, the example represented in FIG. 10 illustrates that a terminal Q of the FF Tf0 is connected to an input terminal of a buffer Rb0 of a sub module RM0.

The control unit 14 is an integrated circuit such as an application specific integrated circuit (ASIC) or a field programmable gate array (FPGA) or an electronic circuit such as a central processing unit (CPU) or a micro processing unit (MPU).

Figure 11:
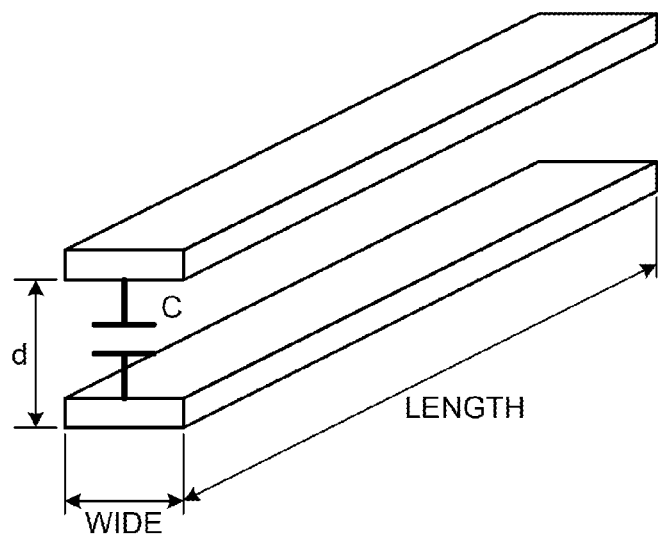
FIG. 11 is a diagram that illustrates an example of a method of calculating Lb and Lf.
Figure 12:
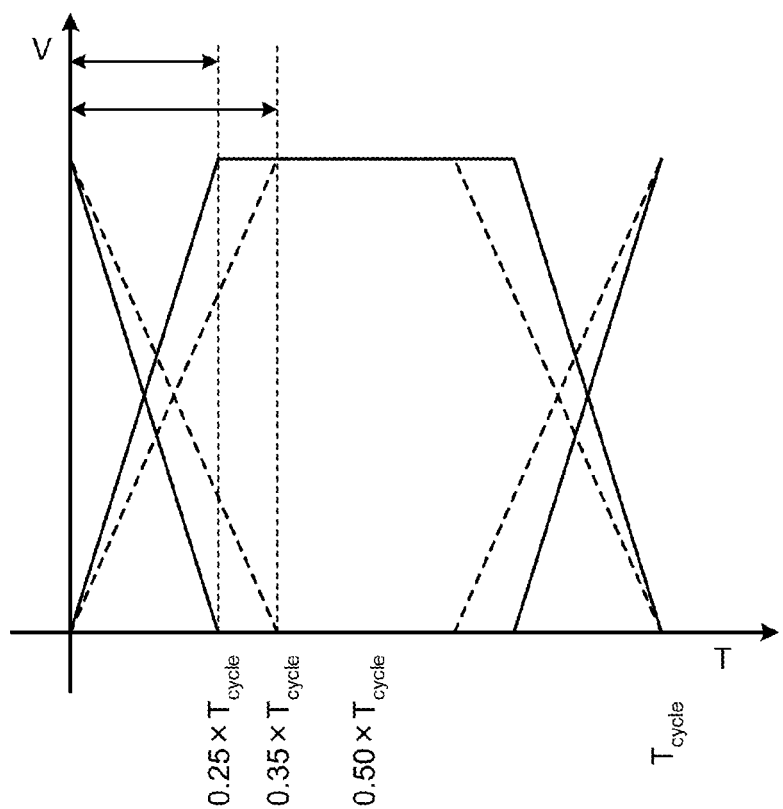
FIG. 12 is a diagram that illustrates an example of a method of calculating Lb and Lf.

Here, an example of a method of calculating Lb and Lf described above will be described. FIGS. 11 and 12 are diagrams that illustrate a method of calculating Lb and Lf.

A tilt $T_{slew}$ [ps] of a signal in a case where there is a current variation $\Delta I$ [μA] in accordance with a voltage variation $\Delta V$ [V] for capacitance C [fF] can be represented by the following Equation (2).

$$T_{slew} = C \times \Delta V / \Delta I \quad (2)$$

FIG. 11 is a schematic diagram of parallel flat plates. The capacitance C can be represented by the following Equation (3) using space permittivity ($\epsilon_0 = 8.854 \times 10^{-12}$ [F/m]), relative permittivity $\epsilon_r$, the area S=(Wide×Length) of the parallel flat plate, and a distance d between the parallel flat plates.

$$C = \varepsilon_0 \times \varepsilon_r \times S / d \quad (3)$$
$$= \varepsilon_0 \times \varepsilon_r \times (\text{Wide}/d) \times \text{Length}$$

As illustrated in FIG. 12, the tilt $T_{slew}$ satisfies the conditions represented by Equations (4) and (5). The tilt $T_{slew}$ in a case where the equality of Equation (4) is satisfied, in other words, in a case where $T_{slew} = 0.25 \times T_{cycle}$ is Lf. In addition, the tilt $T_{slew}$ in a case where the equality of Equation (5) is satisfied, in other words, in a case where $T_{slew} = 0.35 \times T_{cycle}$ is Lb. Here, $T_{cycle}$ is a time for one period.

$$T_{slew} = 0.25 \times T_{cycle} \quad (4)$$

$$T_{slew} = 0.35 \times T_{cycle} \quad (5)$$

Based on the description presented above, a method of calculating Lb and Lf in a case where the frequency is 1 [GHz] ($T_{cycle}=1000$ [ps]) will be described. When a semiconductor process to be used is determined, a width (Wide) of a wiring and a distance (d) between wirings are determined. Here, a case will be described in which the width Wide=2.0 [μm] and the distance d=1.0 [μm]. In such a case, the following Equation (6) is formed by using Equation (3).

$$C = 8.854 \times 10^{-12} \times 4.1 \times (2.0/1.0) \times \text{Length} \quad (6)$$
$$\approx 73 \times \text{Length [fF/mm]}$$

In a case where a current of 0.05 [μA] flows in accordance with a voltage variation of 1.0 [V] ($\Delta V=1.0$ [V]) ($\Delta I=0.05$ [μA]), the following Equation (7) can be derived from Equations (2) and (6).

$$T_{slew} = 73 \times \text{Length} \times 1.0 / 0.05 \quad (7)$$
$$= 1460 \times \text{Length}$$

Here, the following Equation (8) can be derived from Equation (4).

$$\text{Length} \leq 0.25 \times 1000 / 1460 \approx 171 \text{ [μm]} \quad (8)$$

In addition Equation (9) can be derived from Equation (5).

$$\text{Length} \leq 0.35 \times 1000 / 1460 \approx 240 \text{ [μm]} \quad (9)$$

Based on the description presented above, the threshold Lb of the wiring length that is used for determining whether or not logic replication using buffers is performed in the logic circuit is 171 [μm]. In addition, the threshold Lb of the wiring length that is used for determining whether or not logic replication using FFs is performed is 240 [μm]. For example, Lb is a threshold of the wiring length in a case where a normal operation of the circuit is expected, and Lf is a threshold of the wiring length in a case where there is a high possibility that the circuit does not normally operate.

Flow of Process

Figure 13:
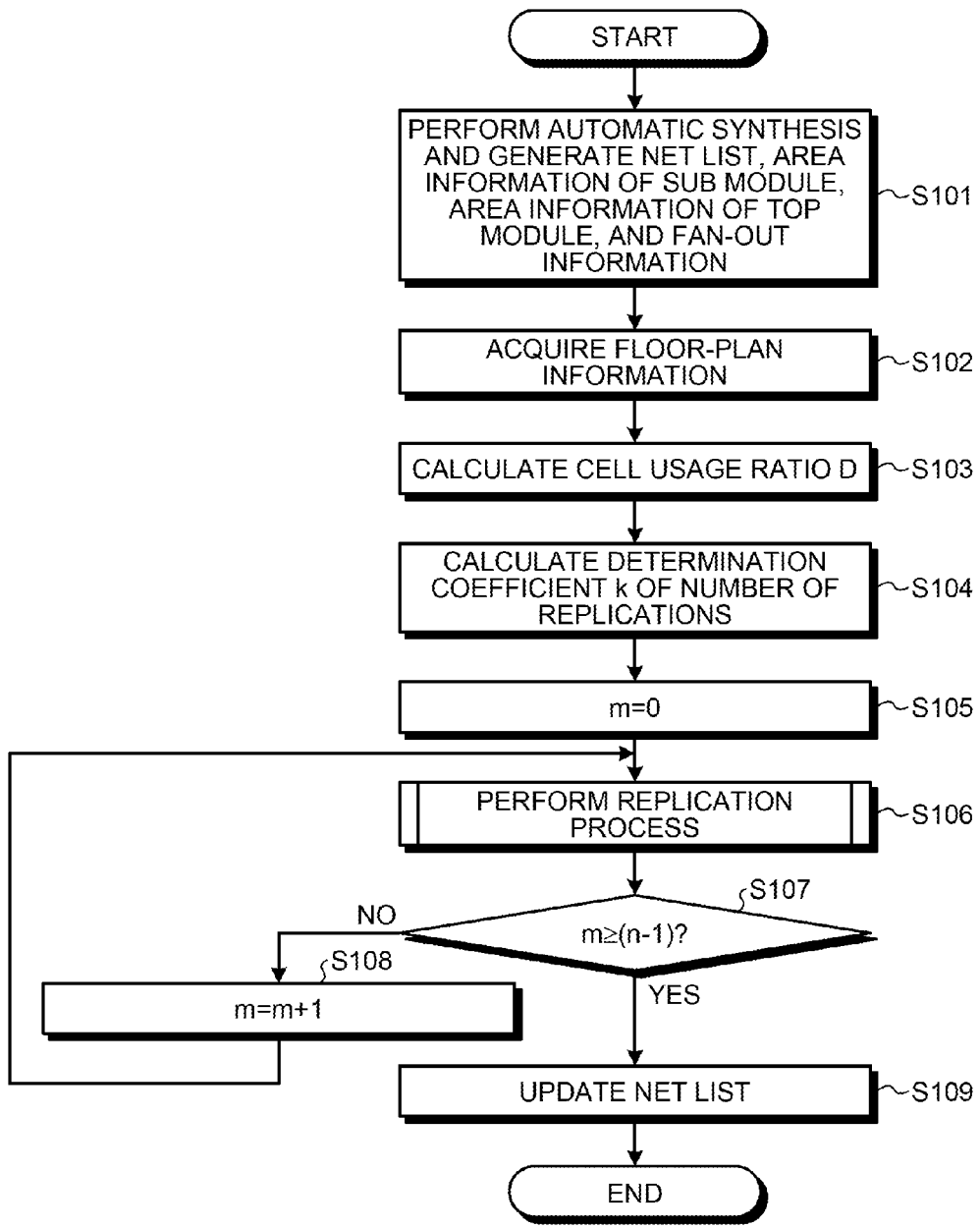
FIG. 13 is a flowchart that illustrates the sequence of a calculation process according to the embodiment.

Next, the flow of the process of the calculation device 10 according to this embodiment will be described. FIG. 13 is a flowchart that illustrates the sequence of a calculation process according to the embodiment. The calculation process, for example, is performed at timing when an instruction for performing the calculation process is received by the control unit 14 from the input unit 11. As described above, an RTL file and a constraint condition are included in this instruction.

As illustrated in FIG. 13, the first calculation unit 14a performs synthesis of a logic circuit so as to satisfy the constraint condition and generates a net list 13a, fan-out information 13b, area information 13c of a sub module, and area information 13d of a top module in Step S101. Then, the third calculation unit 14c acquires the floor plan information 13e from the storage unit 13 in Step S102. Subsequently, the third calculation unit 14c calculates a cell usage ratio D using the floor plan information 13e in Step S103. Subsequently, the third calculation unit 14c calculates a determination coefficient k of the number of replications that is mapped to the cell usage ratio D in Step S104.

Then, the first calculation unit 14a sets the value of a variable m to zero in Step S105. Then, the first calculation unit 14a, the second calculation unit 14b, the third calculation unit 14c, the division unit 14d, the fourth calculation unit 14e, the determination unit 14f, and the generation unit 14g perform a replication process in Step S106. The replication process will be described later. Subsequently, the generation unit 14g determines whether or not the value of the variable m is (n−1) or more in Step S107. Here, n is the number of nets. In a case where the value of the variable m is less than (n−1) (No in Step S107), the generation unit 14g increments the value of the variable m by one in Step S108, and the process is returned to Step S106. On the other hand, in a case where the value of the variable m is (n−1) or more (Yes in Step S107), the generation unit 14g updates the net list 13a so as to reflect data of the logic replication on the net list 13a in Step S109, and the process ends.

Figure 14:
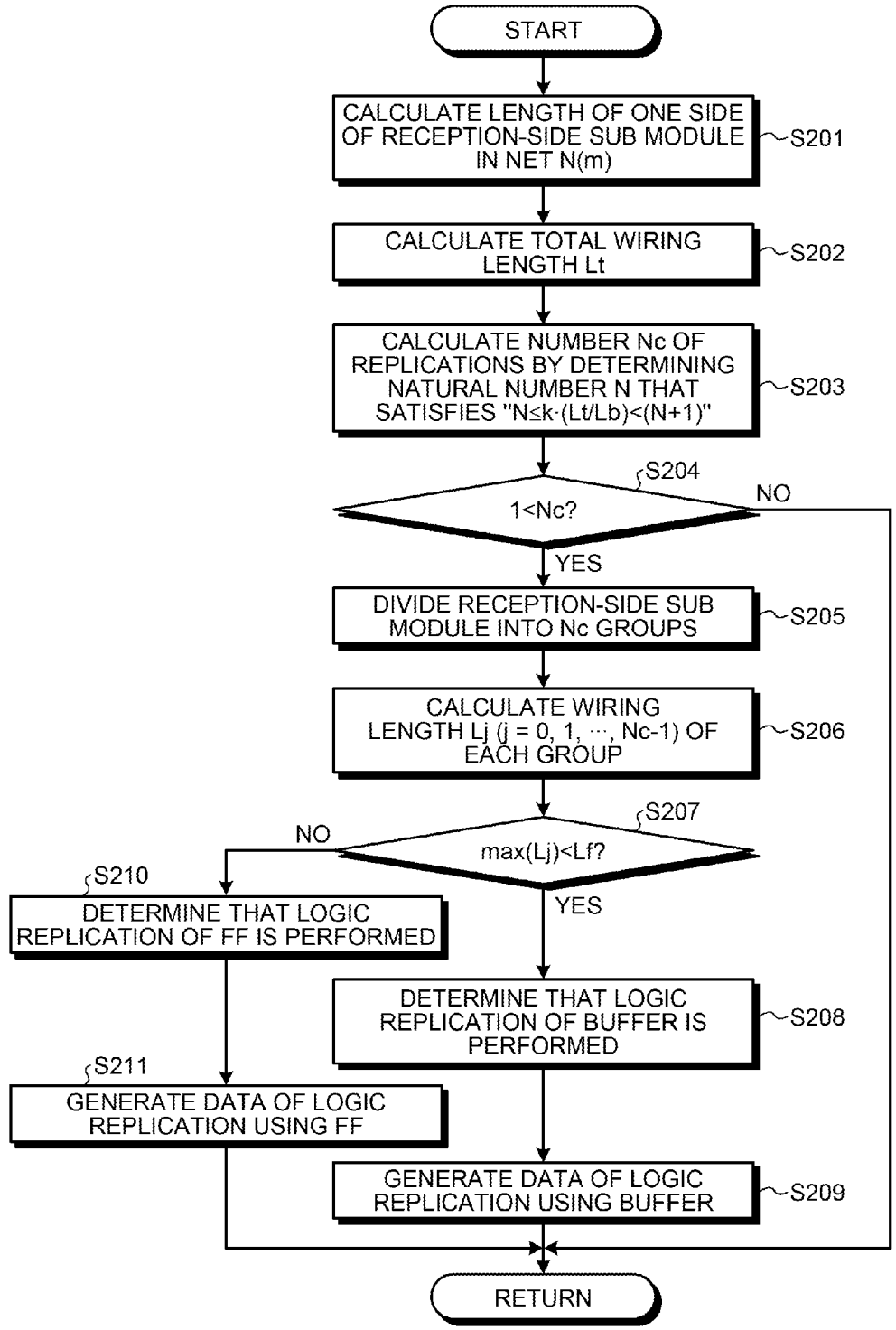
FIG. 14 is a flowchart that illustrates the sequence of a replication process according to the embodiment.

FIG. 14 is a flowchart that illustrates the sequence of the replication process according to the embodiment. As illustrated in FIG. 14, the first calculation unit 14a performs a process as follows for all the sub modules within the net N(m) by referring to the area information 13d of the top module. The first calculation unit 14a assumes the shape of the area of the sub module as a square and calculates the square root of the area of the sub module, thereby calculating the length of one side of the area of the sub module in Step S201.

Subsequently, the second calculation unit 14b calculates a total wiring length Lt for a combination of sub modules that output signals and sub modules that receive input signals based on the length of one side that is calculated by the first calculation unit 14a and the number of fan-outs of a combination of sub modules that output signals and sub modules that receive input signals in Step S202.

Then, the third calculation unit 14c determines a natural number N that satisfies Equation (1) described above and calculates the determined natural number N as the number Nc of replications in Step S203.

Thereafter, the division unit 14d determines whether the number Nc of replications is one or more in Step S204. In a case where the number Nc of replications is one or less (No in Step S204), the division unit 14d stores the processing result in an internal memory, and the process is returned. On the other hand, in a case where the number Nc of replications is one or more (Yes in Step S204), the division unit 14d divides the sub modules into groups corresponding to a number that is represented by the number Nc of replications in Step S205.

Then, the fourth calculation unit 14e calculates the wiring lengths Lj (j=0, 1, ..., Nc-1) of the sub modules in the net N(m) for each group in Step S206.

Thereafter, the determination unit 14f determines whether or not max(Lj) is less that Lf in Step S207. In a case where max(Lj) is less than Lf (Yes in Step S207), the determination unit 14f determines to perform logic replication of buffers in Step S208. Then, the generation unit 14g generates data of logic replication using buffers in accordance with the number Nc of replications in Step S209 and stores the processing result in the internal memory, and the process is returned. Here, the generated data of the logic replication is data that is used for updating the net N(m).

On the other hand, in a case where max(Lj) is Lf or more (No in Step S207), the determination unit 14f determines to perform logic replication of FFs in Step S210. Then, the generation unit 14g generates data of logic replication using FFs in accordance with the number Nc of replications in Step S211 and stores the processing result in the internal memory, and the process is returned.

As described above, the calculation device 10 according to this embodiment assumes the shape of the area of the sub module as a square and calculates a wiring length of a combination of sub modules that output signals and sub modules that receive input signals by using the square root of the area of the sub module. Therefore, according to the calculation device 10 of this embodiment, the wiring length can be calculated in a simple manner.

In addition, the calculation device 10 according to this embodiment calculates the wiring width Lj for each group, determines the type of devices that is logically replicated based on whether or not a maximum value max(Lj) of the wiring lengths Lj is less than LF, and performs logic replication of the devices of the determined type. In other words, the calculation device 10 according to this embodiment performs logic replication without performing a timing analysis and the like. Therefore, according to the calculation device 10 of this embodiment, logic replication is performed regardless of the timing of signals, and accordingly, degradation of the timing that may occur in the physical design process can be avoided in advance.

In addition, since the calculation device 10 according to this embodiment performs logic replication without using information that is acquired in the physical design process, logic replication having high accuracy can be performed before the physical design process.

While the disclosed device according to the embodiment has been described until now, the present invention may be performed in various embodiments other than the above-described embodiment. Thus, hereinafter, other embodiments that belong to the present invention will be described.

For example, in each process described in the embodiment, the whole or a part of the process described as being automatically performed may be performed in a manual manner.

In addition, the whole or a part of the process that has been described as being manually performed in the embodiment may be performed in an automatic manner by using a known method.

In addition, in accordance with various loads, the usage status, and the like, the process performed in each step of each process described in each embodiment may be arbitrarily divided in parts or may be put together. Furthermore, any step may be omitted.

Furthermore, in accordance with various loads, the usage status, and the like, the processing sequence in the steps of each process described in each embodiment may be changed.

In addition, each constituent element of each device illustrated in the diagram is a functional and conceptual element and does not necessarily need to be physically configured as illustrated in the diagram. In other words, a specific state of the division or integration of each device is not limited to that illustrated in the diagram, and the whole or a part thereof may be configured to be functionally or physically divided or integrated in an arbitrary unit.

Calculation Program

Figure 15:
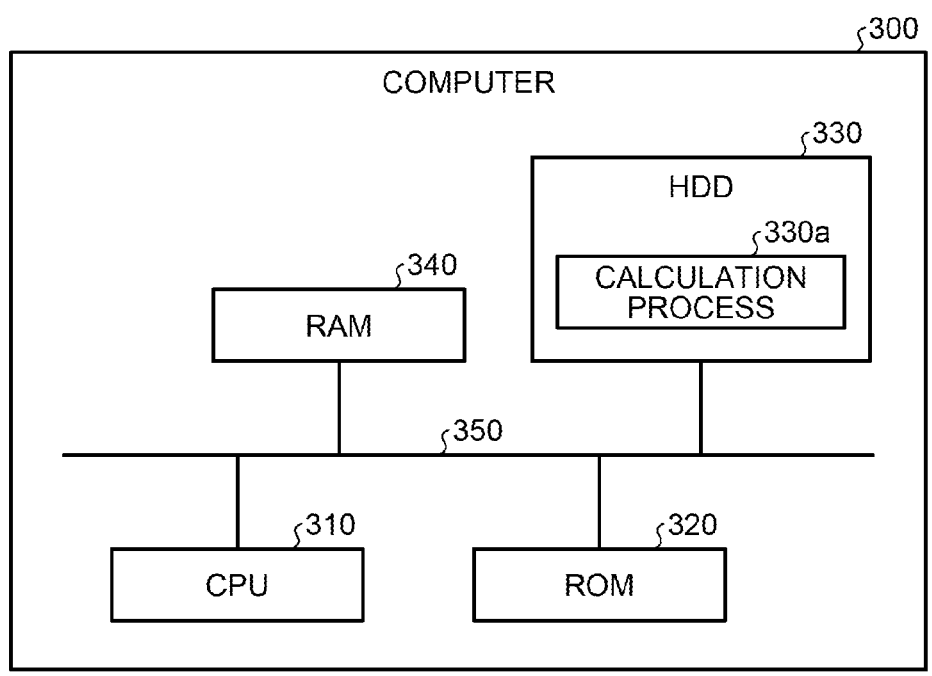
FIG. 15 is a diagram that illustrates a computer that executes a calculation program.

In addition, the process of the calculation device 10 described in the above-described embodiment may be realized by a computer system such as a personal computer or a workstation that executes a program that is prepared in advance. Thus, hereinafter, an example of a computer that executes a calculation program that has the same function as that of the calculation device 10 described in the above-described embodiment will be described with reference to FIG. 15. FIG. 15 is a diagram that illustrates the computer that executes the calculation program.

As illustrated in FIG. 15, a computer 300 includes a central processing unit (CPU) 310, a read only memory (ROM) 320, a hard disk drive (HDD) 330, and a random access memory (RAM) 340. The CPU 310, the ROM 320, the HDD 330, and the RAM 340 are interconnected through a bud 350.

In the ROM 320, a basic program such as an operating system (OS) is stored. In addition, in the HDD 330, a calculation program 330a is stored in advance, which realizes the same functions as those of the first calculation unit, the second calculation unit, the third calculation unit, the division unit, the fourth calculation unit, the determination unit, the generation unit, and the like, as disclosed in the above-described embodiments. Further, the calculation program 330a may be appropriately divided. In addition, a net list, fan-out information, area information of sub modules, area information of a top module, and the like are stored in the HDD 330. The net list, the fan-out information, the area information of sub modules and the area information of the top module correspond to the net list 13a, the fan-out information 13b, the area information 13c of sub modules, and the area information 13d of the top module, as described above.

Then, the CPU 310 reads the calculation program 330a from the HDD 330 and executes the program 330a.

Then, the CPU 310 reads the net list, the fan-out information, the area information of sub modules, the area information of the top module, and the like and stores them in the RAM 340. In addition, the CPU 310 executes the calculation program 330a by using the calculation program 330a by using the net list, the fan-out information, the area information of sub modules, the area information of the top module, and the like that are stored in the RAM 340. Further, all the data that has been described to be stored in the RAM 340 may not be constantly stored in the RAM 340. Data that is used for the process may be stored in the RAM 340.

In addition, the above-described calculation program 330a may not necessarily need to be stored in the HDD 330 from the start.

For example, the program is stored in a "portable physical medium" such as a flexible disc (FD), a CD-ROM, a DVD disc, a magneto-optical disk, or an IC card that is inserted into the computer 300. Then, the computer 300 may be configured to read the program from portable physical medium and execute the program.

Furthermore, the program is stored in "another computer (or a server)" that is connected to the computer 300 through a public circuit, the internet, a LAN, a WAN, or the like. Then, the computer 300 may be configured to read the program from another computer and execute the program.

According to an aspect, the degradation of timing that occurs in the process of performing physical design can be suppressed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A calculation method executed by a computer, the calculation method comprising:
    calculating, using a processor, for a first module that represents a circuit and includes a plurality of second modules that each include devices and are connected to one another, a length of one side of a second module from among the second modules based on an area of the second module; and
    calculating, using the processor, a length, as a wiring length of the first module, based on the calculated length and a number of fan-outs of the first module, the wiring length of the first module representing a total of lengths of wirings by which the second modules are connected to one another.

2. The calculation method according to claim 1, further comprising:
    calculating, using the processor, a number of devices that are logically replicated and are to be included in the second module based on a ratio of areas of devices included in the second modules to an area of the first module;
    dividing, using the processor, the second modules into groups of the calculated number;
    calculating, using the processor, a total length of wirings by which second modules included in a group of the groups are connected to one another, for each of the groups; and
    determining, using the processor, a type of the devices that are logically replicated in the first module based on the calculated total length of wirings.

3. The calculation method according to claim 2, wherein, the determining includes determining to perform logic replication of flip flops when the calculated total length for a group is equal to or larger than a predetermined value.

4. The calculation method according to claim 2, wherein, the determining includes determining to perform logic replication of buffers when the calculated total length for each of the groups is smaller than a predetermined value.

5. The calculation method according to claim 1, wherein, the calculating the length of one side includes calculating the square root of the area of the second module.

6. A computer-readable recording medium having stored therein a calculation program causing a computer to execute a process, the process comprising:
    calculating, for a first module that represents a circuit and includes a plurality of second modules that each include devices and are connected to one another, a length of one side of a second module from among the second modules based on an area of the second module; and
    calculating a length, as a wiring length of the first module, based on the calculated length and a number of fan-outs of the first module, the wiring length of the first module representing a total of lengths of wirings by which the second modules are connected to one another.

* * * * *